(12) United States Patent
Wu et al.

(10) Patent No.: US 7,368,369 B2
(45) Date of Patent: May 6, 2008

(54) METHOD FOR ACTIVATING P-TYPE SEMICONDUCTOR LAYER

(75) Inventors: Bor-Jen Wu, Taipei (TW); Nae-Guann Yih, Yuan (TW); Yuan-Hsiao Chang, Taipei (TW)

(73) Assignee: Uni Light Technology Inc., Tao-Yuan (TW)

( * ) Notice: Subject to any disclaimer, the term of this patent is extended or adjusted under 35 U.S.C. 154(b) by 398 days.

(21) Appl. No.: 11/049,981

(22) Filed: Feb. 4, 2005

(65) Prior Publication Data

US 2005/0130396 A1    Jun. 16, 2005

Related U.S. Application Data

(63) Continuation-in-part of application No. 10/377,605, filed on Mar. 4, 2003, now abandoned.

(51) Int. Cl.
| H01L 21/322 | (2006.01) |
| H01L 21/04  | (2006.01) |
| H01L 21/302 | (2006.01) |
| H01L 21/31  | (2006.01) |

(52) U.S. Cl. ............... 438/510; 438/475; 438/758; 438/788; 257/E21.212

(58) Field of Classification Search ............ 438/510, 438/758, 475, 788; 257/E21.212
See application file for complete search history.

(56) References Cited

U.S. PATENT DOCUMENTS 5,059,551 A * 10/1991 Chevallier et al. .......... 438/507
6,313,035 B1 * 11/2001 Sandhu et al. .............. 438/681
6,475,923 B1 * 11/2002 Mitamura ................... 438/758
6,521,999 B1 *  2/2003 Uemura et al. .............. 257/745
2004/0107833 A1 *  6/2004 Sweeney et al. ............. 95/116

* cited by examiner

Primary Examiner—Scott B. Geyer
Assistant Examiner—Seahvosh Nikmanesh
(74) Attorney, Agent, or Firm—Rosenberg, Klein & Lee

(57) ABSTRACT

A method for activating the P-type semiconductor layer of a semiconductor device is disclosed in this present invention. The above-mentioned method can activate the impurities in the P-type semiconductor layer of a semiconductor device by plasma. The plasma comprises a gas source including a VI Group compound element. The performance of the semiconductor device activated by plasma according to this invention is similar to the performance of the semiconductor device activated by heat in the prior art. Therefore, this invention can provide a method, other then heat, for activating the P-type semiconductor layer of a semiconductor device. Moreover, in this invention, during the activating process by plasma, the layers other than P-type semiconductor layer will not be affected by plasma. That is, the activating process according to this invention will not cause any side-reactions in the layers other than the P-type semiconductor layer of a semiconductor device. Thus, this invention discloses an efficient method for activating a P-type semiconductor layer of a semiconductor structure by plasma instead of heat.

22 Claims, 1 Drawing Sheet

METHOD FOR ACTIVATING P-TYPE SEMICONDUCTOR LAYER

This application is a continuation-in-part of U.S. patent application Ser. No. 10/377,605, filed Mar. 4, 2003 now abandoned.

BACKGROUND OF THE INVENTION

1. Field of the Invention

This present invention relates to a method for activating a semiconductor structure, and more particularly to a method for activating a P-type semiconductor layer of a semiconductor structure.

2. Description of the Prior Art

In recent years, The Light-Emitting Diode (LED) has become more and more popular. However, a blue light-emitting device employing a blue color-emitting element has not yet been developed as a practical device. Actually, P-type III-V Group compound semiconductor having a sufficiently low-resistance cannot be produced by any conventional techniques. In the case of a GaN series compound semiconductor, as an active layer of an LED, there is a tendency for the semiconductor to exhibit n-type characteristics even without doping an n-type impurity. Therefore, some P-type dopants, such as Mg or Zn, are doped into the GaN series compound semiconductor. Even by conventional chemical vapor deposition or any like method while doping P-type impurities, it is impossible to make III-V Group compound semiconductor characteristic P-type. That is because an activating process is necessary after developing the III-V Group compound semiconductor.

In the prior art, one well-known method for activating the active layer is heating the LED structure with a furnace or through a rapid thermal annealing process. The above-mentioned method sends the substrate with the active layer thereon into a high temperature furnace, to activate the active layer. The substrate with the active layer thereon is heated under a temperature about hundreds of degree C. According to the above-mentioned method, the active layer can be activated under the high temperature, but the other portion of the LED may be hurt under the temperature.

Another well-known method for activating the active layer is irradiating electron beams on the active layer. According to this method, the uppermost active layer is activated by irradiating electron beams while maintaining a surface temperature of the active layer at 600° C. or higher. However, this method still activates the active layer by heat. Moreover, the above-mentioned method is rarely applied on manufacturing process, because the method cannot be easily applied on a wide semiconductor device.

Hence, it is an important object, in developing a method for activating the active layer of a semiconductor device without thermal effects to lower the resistance of a semiconductor device and optimize the performance of the semiconductor device.

SUMMARY OF THE INVENTION

In accordance with the present invention, a method for activating the P-type semiconductor layer of a semiconductor device is provided, wherein the method according to this invention can activate the P-type semiconductor layer of a semiconductor device.

It is another object of this invention to provide a method for activating the P-type semiconductor layer of a semiconductor device. The above-mentioned method employs plasma to lower the resistance of a semiconductor device, thus the P-type semiconductor layer of the semiconductor device can be activated by the method according to this invention.

Still another object of this invention is to provide a method for activating the P-type semiconductor layer of a semiconductor device. The above-mentioned method employs plasma to activate the P-type impurities in the P-type semiconductor layer of a semiconductor device, and thus the P-type semiconductor layer can show P-type characteristics.

Still another object of this invention is to provide a method for activating the P-type semiconductor layer of a semiconductor device. According to this invention, a semiconductor device is activated by plasma without a thermal effect. Thus, the performance of the semiconductor device activated by plasma according to this invention is similar to, or even better than, the performance of the semiconductor device, activated by a thermal effect in the prior art.

In accordance with the above-mentioned objects, the invention provides a method for activating the P-type semiconductor layer of a semiconductor device. The above-mentioned method comprises the following steps: providing a substrate, forming a semiconductor layer with P-type impurities therein on the substrate, and reacting the semiconductor layer with plasma for activating the semiconductor device. The gas source of the plasma according to this invention may be oxygen ($O_2$), NO, $N_2O$, or other gas including the elements of the VI Group. In this invention, the P-type impurities are activated by the above-mentioned plasma. Moreover, the performance of the semiconductor device activated by plasma according to this invention is similar to the performance of the semiconductor device activated by heat in the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1:
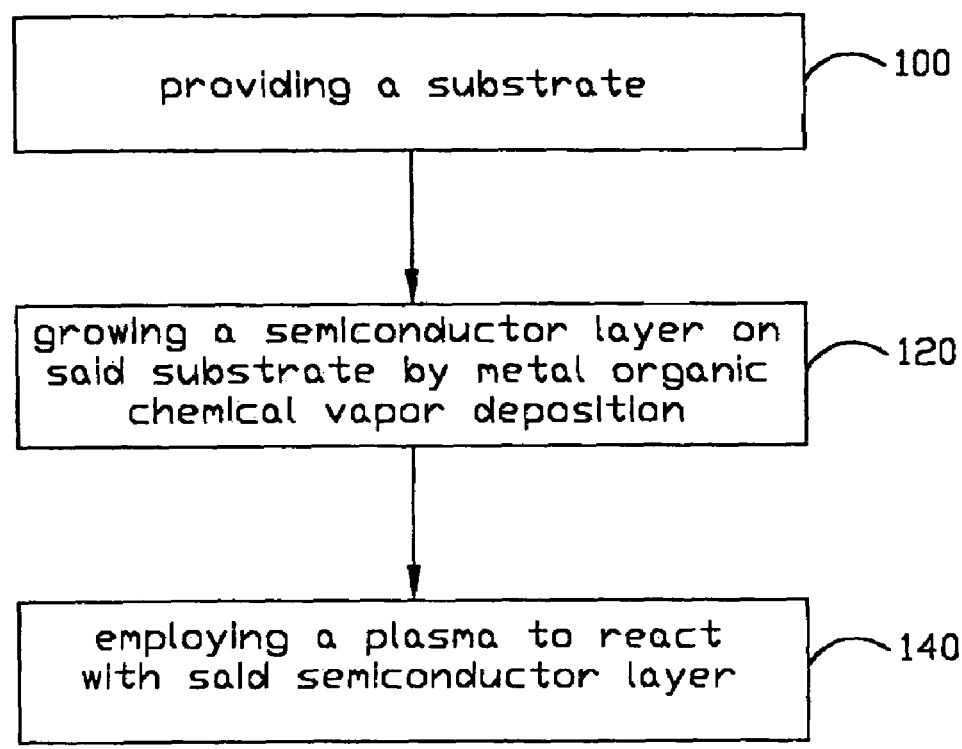
FIG. 1 is a diagram showing a flow chart for activating a P-type semiconductor layer of a semiconductor device according to this invention.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Then, the components of the devices in this application are not shown to scale. Some dimensions are exaggerated to the related components to provide a more clear description and comprehension of the present invention.

One preferred embodiment of this invention is a method for activating a semiconductor device. First of all, P-type semiconductor layer is formed on a substrate by metal organic chemical vapor deposition (MOCVD) so that a single-crystalline semiconductor layer is formed. The substrate may comprise sapphire, SiC, Si, GaAs, or other materials. The P-type semiconductor layer comprises a III-V Group compound such as GaN, or other compounds. Subsequently, the P-type semiconductor layer is activated by plasma. The gas source of the plasma may be $O_2$, NO, $N_2O$, or other gas including an element of VI Group.

Generally, some impurities are doped into the P-type semiconductor layer of a semiconductor device. The impurity comprises at least a di-valence element. Examples of the P-type impurity are Zn, Cd, Be, Mg, Ca, Ba, and the others. For instance, in the P-type semiconductor layer of III-V Group, such as GaN series compound semiconductor, some P-type impurities of Mg, Zn, the impurities comprising II Group, or others are doped for making the III-V Group compound semiconductor characteristic P-type. In another case, in the P-type semiconductor layer, some P-type impurities comprising V Group, or others are doped for making the semiconductor layer characteristic P-type. However, during the manufacturing of a semiconductor device, the impurities will bond with hydrogen atoms, or other atoms formed in the manufacture of the semiconductor device, and the performance of the semiconductor device is decreased. In this preferred embodiment, the above-mentioned bonding of the impurities is broken by the plasma to activate the P-type semiconductor layer of the semiconductor device.

Compared with the activating method in the prior art, the activating method disclosed in this embodiment, can activate the P-type semiconductor layer of a semiconductor device at a temperature lower than the temperature of the activating method in the prior art. The temperature of the activating method according to this embodiment is lower than 400° C. On the other hand, during the activating process according to this embodiment, other layers of the semiconductor device may not be affected by adjusting the power of the plasma. In the prior art, because all the semiconductor device structure is sent into a stove and heated at a temperature higher than 600° C. to activate the P-type semiconductor layer of the semiconductor device, some unwanted reactions may carry out in the other structures of the semiconductor device during the activating process in the prior art.

Another preferred embodiment of this present invention is a method for activating the P-type semiconductor layer of a semiconductor device. The above-mentioned semiconductor device may be a light-emitting device (LED), wherein said LED may emit blue light, purple light, or ultraviolet. FIG. 1 depicts a flowchart for activating a semiconductor device according to this embodiment. As shown in step 100 in FIG. 1, a substrate is provided at first. The substrate may be made of sapphire, SiC, Si, GaAs, or the like. Next, a P-type semiconductor layer is formed on the substrate, as shown in the step 120. The P-type semiconductor layer comprises a III-V Group compound, or other compounds, such as GaN. The P-type semiconductor layer further comprises at least a P-type impurity. The P-type impurity comprises a di-valence element. In some cases of this embodiment, the P-type impurity comprises Zn, Cd, Be, Mg, Ca, Ba, or the mixture material thereof. The semiconductor device may comprise other structure(s) between the substrate and the P-type semiconductor layer.

Subsequently, as shown in step 140, the P-type semiconductor layer is activated by plasma. The gas source of the plasma may be $O_2$, NO, $N_2O$, or other gases with the element of Group VI. Hydrogen (H) or other atoms may be produced during the growing of the P-type semiconductor layer or other layers of the semiconductor device. The above-mentioned atoms may bond with the impurities to prevent the P-type impurities from acting as an acceptor.

Thus, the P-type semiconductor layer cannot exhibit any P-type characteristics. However, the plasma according to this preferred embodiment efficiently provides the above-mentioned bonding between the atoms and the P-type impurities. The P-type impurities free from atoms such as hydrogen can act normally as an acceptor, and the P-type semiconductor layer is activated. Furthermore, the performance of the semiconductor device activated by plasma according to this embodiment is similar to or better than the performance of the semiconductor device activated by heat in the prior art.

In the prior art, the P-type semiconductor layer is activated by sending the substrate and the layers on the substrate into a furnace and heated to a temperature higher than 600° C. Another method for activating the P-type semiconductor layer in the prior art is to use irradiating electron beams on the P-type semiconductor layer while maintaining a surface temperature of the P-type semiconductor layer at 600° C. or higher. The P-type semiconductor layers in both of the above-cited method are activated by heat. However, in this preferred embodiment, breaking the unwanted bonding between the impurities and the atoms with the plasma activates the P-type semiconductor layer. Even though the temperature of the P-type semiconductor layer may be increased by activating with plasma, the temperature of the P-type semiconductor layer is lower than 400° C. Therefore, this preferred embodiment provides an activating method by plasma instead of heat.

Figure 2:
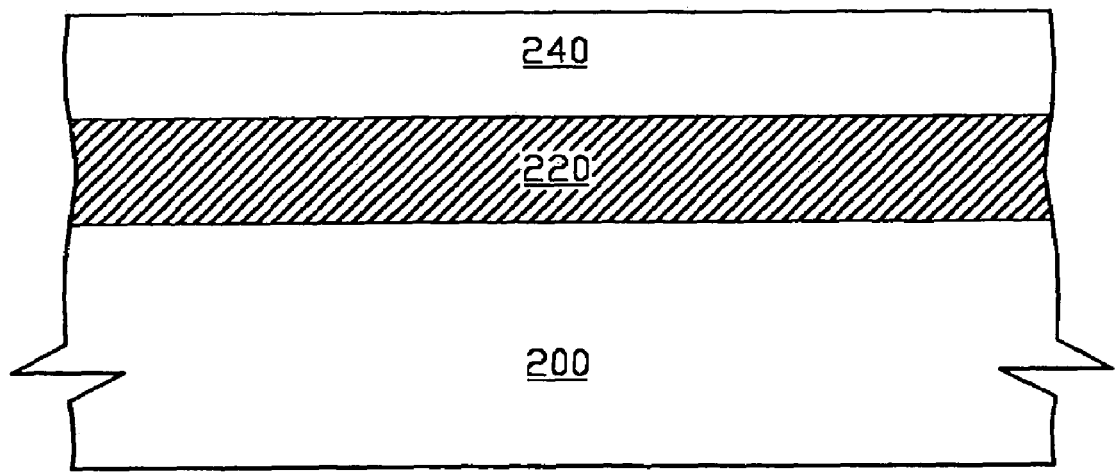
FIG. 2 shows a semiconductor structure according to this present invention.

Another preferred embodiment according to this invention is a method for activating a P-type semiconductor layer of a semiconductor device. The above-mentioned semiconductor device may be a light-emitting device with blue light, purple light, or ultraviolet. FIG. 2 shows the semiconductor device according to this embodiment. At first, a substrate 200 is provided, as shown in FIG. 2. The substrate 200 is made of sapphire, SiC, Si, GaAs, or other IV-IV Group compounds. A semiconductor layer 220 is formed on the substrate 200 by metal organic chemical vapor deposition (MOCVD) so that a single-crystalline semiconductor layer is formed, and an oxide layer 240 is developed on the semiconductor 220. The semiconductor layer 220 may be the P-type semiconductor layer of the semiconductor device. The semiconductor layer 220 comprises a III-V Group compound element as GaN. The semiconductor layer 220 further comprises the P-type impurities. The P-type impurities at least comprise the compound comprising a di-valence element. In some cases of this embodiment, the P-type impurities comprise Mg, Zn, or other P-type impurities, such as the impurities comprising a II Group element. A well-known process, such as metal organic chemical vapor deposition (MOCVD) develops the semiconductor layer 220. The above-mentioned semiconductor device may further comprise other structure between the substrate 200 and the oxide layer 240.

During the development of the semiconductor layer 220, hydrogen or other atoms may be produced. The atoms may bond with the P-type impurities in the semiconductor layer 220 to prevent the P-type impurities from acting as acceptors. In one case of developing a GaN series compound semiconductor layer, $NH_3$ is generally employed as an N source. During the development of the semiconductor layer, $NH_3$ is decomposed as atomic hydrogen. These hydrogen atoms will bond to Mg, Zn, or any like dopant as an acceptor of impurities to prevent the P-type impurity from acting as an acceptor.

In this preferred embodiment, the hydrogen bonded to Mg or Zn in the form of Mg—H is released therefrom by the plasma. The LED structure including the substrate 200 and the layers thereon are sent into a chamber to perform the activating process. During the activating process, the platen power, for supporting the substrate 200 is about 10-40 W, and the coil power of the plasma is about 400-900 W. The gas source of the plasma is $O_2$, and the flow rate of $O_2$ is about 10-80 sccm. The pressure of the chamber is about 20-60 mTorr. Except $O_2$, NO, $N_2O$, or other gases including a VI Group compound element, or a mixture of gas thereof can also be employed as the gas source of the plasma.

Table 1 depicts the comparison between the LED activated by plasma and the LED activated by heat. In Table 1, the numbers 1-1, 1-2, and 1-3 shows the deferent LED devices produced in the same batch of LED devices. There are four batches of LED devices shown in Table 1. In each batch of the LED devices, some of the LED devices are activated by plasma, and the other LED devices are activated by heat.

TABLE 1 comparison between the LED activated by plasma and the LED activated by heat

| NO. | Activating method | Illumination (Lop) | Threshold voltage (Vf) |
|---|---|---|---|
| 1-1 | Plasma | 3.65 | 3.33 |
| 1-2 | Plasma | 3.76 | 3.40 |
| 1-3 | Heat | 3.47 | 3.33 |
| 2-1 | Plasma | 3.41 | 3.25 |
| 2-2 | Plasma | 3.25 | 3.25 |
| 2-3 | Heat | 3.15 | 3.31 |
| 2-4 | Heat | 3.14 | 3.28 |
| 3-1 | Plasma | 3.34 | 3.26 |
| 3-2 | Plasma | 3.505 | 3.23 |
| 3-3 | Heat | 3.23 | 3.30 |
| 3-4 | Heat | 3.16 | 3.31 |
| 4-1 | Plasma | 3.17 | 3.25 |
| 4-2 | Plasma | 3.23 | 3.28 |
| 4-3 | Heat | 3.03 | 3.28 |
| 4-4 | Heat | 3.17 | 3.32 |

From Table 1, it has been found that the plasma according to this embodiment can activate the P-type semiconductor layer of a LED device efficiently. Preferably, the performance of the LED activated by plasma according to this embodiment is similar to, even better than, the performance of the LED activated by heat in the prior art.

In another case of this embodiment, the P-type semiconductor layer can be activated by the following condition. In this case, the coil power is about 5-30 W. The gas source of the plasma may be $NO_2$, and the flow rate is about 200~800 sccm. The pressure of the chamber is about 100~400 mTorr.

Compared with the activated method in the prior art, this embodiment employs plasma instead of heat to break the bonding between hydrogen atoms and the impurities. In the prior art, the hydrogen atom bonded to the impurities by heat at the temperature higher than 600° C. In this embodiment, even though the surface temperature of the semiconductor layer 220 may be increased by the plasma, the surface temperature is still far lower than 400° C.

Moreover, the entire semiconductor structure is heated under a high temperature at hundreds to thousands of degree C.; some unwanted reaction might be driven on to other layers of the semiconductor structure. However, during the activating process according to this embodiment, the plasma only reacts with the P-type semiconductor layer of the semiconductor device. Therefore, the plasma will not affect other portions of the semiconductor device.

According to the preferred embodiments, this invention discloses a method for activating the P-type semiconductor layer of a semiconductor device. The above-mentioned method can activate the impurities in the P-type semiconductor layer of a semiconductor device by plasma. The plasma employs a gas source including a VI Group compound element. The performance of the semiconductor device activated by plasma according to this invention is similar to the performance of the semiconductor device activated by heat in the prior art. Therefore, this invention can provide a method, other then heat, for activating the P-type semiconductor layer of a semiconductor device. Moreover, according to this invention, during the activating process by plasma, the layers other than P-type semiconductor layer will not be affected by plasma. That is, the activating process according to this invention will not cause any side-reactions in the layers other than the P-type semiconductor layer of a semiconductor device. Thus, this invention discloses an efficient method for activating a P-type semiconductor layer of a semiconductor structure by plasma instead of heat.

Although specific embodiments have been illustrated and described, it will be obvious to those skilled in the art that various modifications may be made without departing from what is intended, but not to be limited solely by the appended claims.

What is claimed is:

1. A method for activating a P-type semiconductor layer, wherein said P-type semiconductor layer is a semiconductor layer of a semiconductor device, comprising:
   providing a substrate;
   forming a single crystalline semiconductor layer having impurities as donors or acceptors on said substrate by metal organic chemical vapor deposition; and
   employing a plasma on said single crystalline semiconductor layer to activate said single crystalline semiconductor layer by said plasma breaking bonding between said impurities and atoms inside said single crystalline semiconductor layer at a temperature below about 400° C., wherein said atoms comprise hydrogen atoms, and the bonding between said impurities and said atoms will destroy the function of said impurities as donors or acceptors.

2. The method according to claim 1, wherein said plasma comprises a gas source comprising at least a VI Group compound element.

3. The method according to claim 1, wherein said single crystalline semiconductor layer comprises a III-V Group compound element.

4. The method according to claim 1, wherein said semiconductor layer comprises P-type impurities.

5. The method according to claim 4, wherein said P-type impurity comprises a di-valence element.

6. The method according to claim 4, wherein said P-type impurity is selected from the group of Zn, Cd, Be, Mg, Ca, Ba, or an impurity of a mixture material thereof.

7. A method for activating a P-type semiconductor layer of a semiconductor device, comprising:
   providing a substrate;
   forming a single crystalline semiconductor layer having P-type impurities as acceptors on said substrate by metal organic chemical vapor deposition; and
   employing a plasma on said single crystalline semiconductor layer to activate said single crystalline semiconductor layer by said plasma breaking bonding between said P-type impurities and atoms inside said single crystalline semiconductor layer at a temperature below about 400° C., wherein said atoms comprise hydrogen atoms, and the bonding between said impurities and said atoms will destroy the function of said impurities as acceptors.

8. The method according to claim 7, wherein said plasma comprises a gas source comprising at least a VI Group compound element.

9. The method according to claim 7, wherein said plasma comprises a gas source comprising $O_2$.

10. The method according to claim 7, wherein said plasma comprises a gas source comprising NO.

11. The structure according to claim 7, wherein said plasma comprises a gas source comprising $N_2O$.

12. The method according to claim 7, wherein said semiconductor layer comprises a III-V Group compound element.

13. The method according to claim 7, wherein said P-type impurity comprises a di-valence element.

14. The method according to claim 7, wherein said P-type impurity is selected from the group of Zn, Cd, Be, Mg, Ca, Ba, or an impurity of a mixture material thereof.

15. A method for activating a P-type semiconductor layer of a semiconductor device, comprising:
providing a substrate;
forming a single crystalline semiconductor layer having P-type impurities as acceptors on said substrate by metal organic chemical vapor deposition; and
employing a plasma on said single crystalline semiconductor layer to activate said single crystalline semiconductor layer by said plasma breaking bonding between said P-type impurities and atoms inside said single crystalline semiconductor layer at a temperature below about 400° C., wherein said plasma comprises a gas source comprising at least a gas with oxygen atom, and said atoms comprise hydrogen atoms, and the bonding between said impurities and said atoms will destroy the function of said impurities as acceptors.

16. The method according to claim 15, wherein said gas source comprises $O_2$.

17. The method according to claim 15, wherein said gas source comprises NO.

18. The method according to claim 15, wherein said gas source comprises $N_2O$.

19. The method according to claim 15, wherein said semiconductor layer comprises GaN.

20. The method according to claim 15, wherein said P-type impurity at least comprises a II Group element.

21. The method according to claim 15, wherein said P-type impurity comprises Mg.

22. The method according to claim 15, wherein said P-type impurity comprises Zn.

* * * * *